United States Patent
Hung et al.

(10) Patent No.: US 7,321,285 B2
(45) Date of Patent: Jan. 22, 2008

(54) METHOD FOR FABRICATING A TRANSFORMER INTEGRATED WITH A SEMICONDUCTOR STRUCTURE

(75) Inventors: Cheng-Chou Hung, Chang-Hua Hsien (TW); Hua-Chou Tseng, Hsin-Chu (TW); Victor-Chiang Liang, Hsin-Chu (TW); Yu-Chia Chen, Taipei (TW); Tsun-Lai Hsu, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/736,565

(22) Filed: Apr. 17, 2007

(65) Prior Publication Data

US 2007/0236320 A1    Oct. 11, 2007

Related U.S. Application Data

(62) Division of application No. 11/278,952, filed on Apr. 6, 2006.

(51) Int. Cl.
*H01F 5/00*    (2006.01)
(52) U.S. Cl. ...................................... 336/200
(58) Field of Classification Search .................. 336/65, 336/83, 192, 200, 232; 257/531
See application file for complete search history.

(56) References Cited

U.S. PATENT DOCUMENTS

| | | | |
|---|---|---|---|
| 3,614,554 A * | 10/1971 | Shield et al. ................ | 257/531 |
| 4,246,044 A | 1/1981 | Yanase | |
| 5,293,025 A | 3/1994 | Wang | |
| 5,874,883 A * | 2/1999 | Uemura et al. ............. | 336/200 |
| 6,181,012 B1 | 1/2001 | Edelstein et al. | |
| 6,338,974 B1 | 1/2002 | Strnad | |
| 6,459,135 B1 * | 10/2002 | Basteres et al. ............ | 257/528 |
| 6,573,822 B2 * | 6/2003 | Ma et al. .................... | 336/223 |
| 6,586,322 B1 * | 7/2003 | Chiu et al. .................. | 438/612 |
| 6,727,138 B2 | 4/2004 | Girardie | |
| 6,998,952 B2 * | 2/2006 | Zhou et al. ................. | 336/200 |
| 7,262,069 B2 * | 8/2007 | Chung et al. ................ | 438/48 |

\* cited by examiner

*Primary Examiner*—Tuyen T. Nguyen
(74) *Attorney, Agent, or Firm*—Winston Hsu

(57) ABSTRACT

A substrate is provided and a top interconnection metal layer and a primary winding layer are formed thereon. Then a passivation layer having a plurality of via exposed parts of the top interconnection metal layer is formed on the substrate. A secondary winding layer and at least a bonding pad are formed on the passivation layer. The bonding pad electrically connects to the top interconnection metal layer through the via.

13 Claims, 11 Drawing Sheets

METHOD FOR FABRICATING A TRANSFORMER INTEGRATED WITH A SEMICONDUCTOR STRUCTURE

CROSS REFERENCE TO RELATED APPLICATIONS

This application is a divisional of application Ser. No. 11/278,952 filed Apr. 6, 2006.

BACKGROUND OF THE INVENTION

1. Field of the Invention

The present invention relates to a method for fabricating a transformer integrated with a semiconductor structure, and more particularly, to a method utilizing copper interconnection technology for fabricating a transformer.

2. Description of the Prior Art

It is known in the art that there is an ever-present demand for decreasing the sizes and geometries of electronic components. The demand for decreasing the size of consumer communication and information processing devices has resulted in a general trend in the market to integrate electronic components such as inductors and transformers on a chip.

Please refer to FIGS. 1-5 which are schematic drawings illustrating a method for fabricating a transformer provided by U.S. Pat. No. 6,727,138. In general, the transformer integrated in the semiconductor structure is fabricated in the back-end-of-the-line (BEOL). For example, the transformer is fabricated after completing the fabrication of the contact pads. As shown in FIG. 1, an integrated circuit structure 100 comprises a substrate 102, a top interconnection metal layer 104 formed by the copper interconnection technology, a protection layer 106, and a metal pad 108 formed on the top interconnection metal layer 104.

Please refer to FIGS. 2 and 3. A dielectric layer 110 is formed on the substrate 102. Then a via 112 corresponding to the metal pad 108 is sequentially formed by the photo-etching process (PEP) on the dielectric layer 110 and exposes the metal pad 108. And a copper-diffusion barrier layer 114 is formed on the bottom and the sides of the dielectric layer 110 and the via 112.

Thereafter, as shown in FIGS. 4 and 5, a primary winding layer 116, a passivation layer 118, and a secondary winding layer 120 filling the via 112 are successively formed on the copper-diffusion barrier layer 114, and then a transformer having a coil pattern and electrically connected to the metal pad 108 is obtained.

As abovementioned, the conventional method for fabricating a transformer integrated with a semiconductor structure is performed in back-end-of-the-line (BEOL), especially after completing the fabrication of the metal pad. Therefore the processes are not only complicated, but also increase the cost of manufacturing. Furthermore, as shown in FIG. 5, because the primary winding layer 116 and the secondary winding layer 120 are exposed to the environment, these metal layers are apt to be effected by the moisture and the particles outside, resulting in a poor electrical performance. To solve this problem, there are two main methods in the art: forming a protection layer to entirely cover the primary winding layer and the secondary winding layer after completing the fabrication of the transformer with another PEP performed to expose the metal pad; or encapsulating the chip bearing the transformer by a common mold compound.

SUMMARY OF THE INVENTION

Therefore, it is an object of the present invention to provide a method for fabricating a transformer integrated with a semiconductor structure to solve the problem of the transformer fabricating process and the other semiconductor fabricating processes being performed separately and to simplify the processes.

According to the claimed invention, a method for fabricating a transformer integrated with a semiconductor structure is provided. The method comprises providing a substrate, simultaneously forming a top interconnection metal layer and a primary winding layer on the substrate, forming a passivation layer covering the top interconnection metal layer and the primary winding layer on the substrate, the passivation layer further having a plurality of openings exposing parts of the top interconnection metal layer, and simultaneously forming a secondary winding layer and at least a bonding pad on the passivation layer, the bonding pad being electrically connected to the top interconnection metal layer through the openings.

According to the claimed invention, a transformer integrated with a semiconductor structure is further provided. The transformer comprises a substrate, a primary winding layer and a top interconnection metal layer formed on the substrate, a passivation layer formed on the primary winding layer and the top interconnection metal layer, the passivation layer having a plurality of openings exposing parts of the top interconnection metal layer, and a secondary winding layer and at least a bonding pad respectively formed on the passivation layer and the top interconnection metal layer, the bonding pad being electrically connected to the top interconnection metal layer through the openings. The primary winding layer and the secondary winding layer construct the transformer.

According to the method provided by the present invention, a transformer integrated with a semiconductor structure is obtained by simultaneously forming the primary winding layer of the transformer and the top interconnection layer and simultaneously forming the secondary winding layer and the bonding pad. Therefore the purpose to simplify the fabricating processes is achieved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
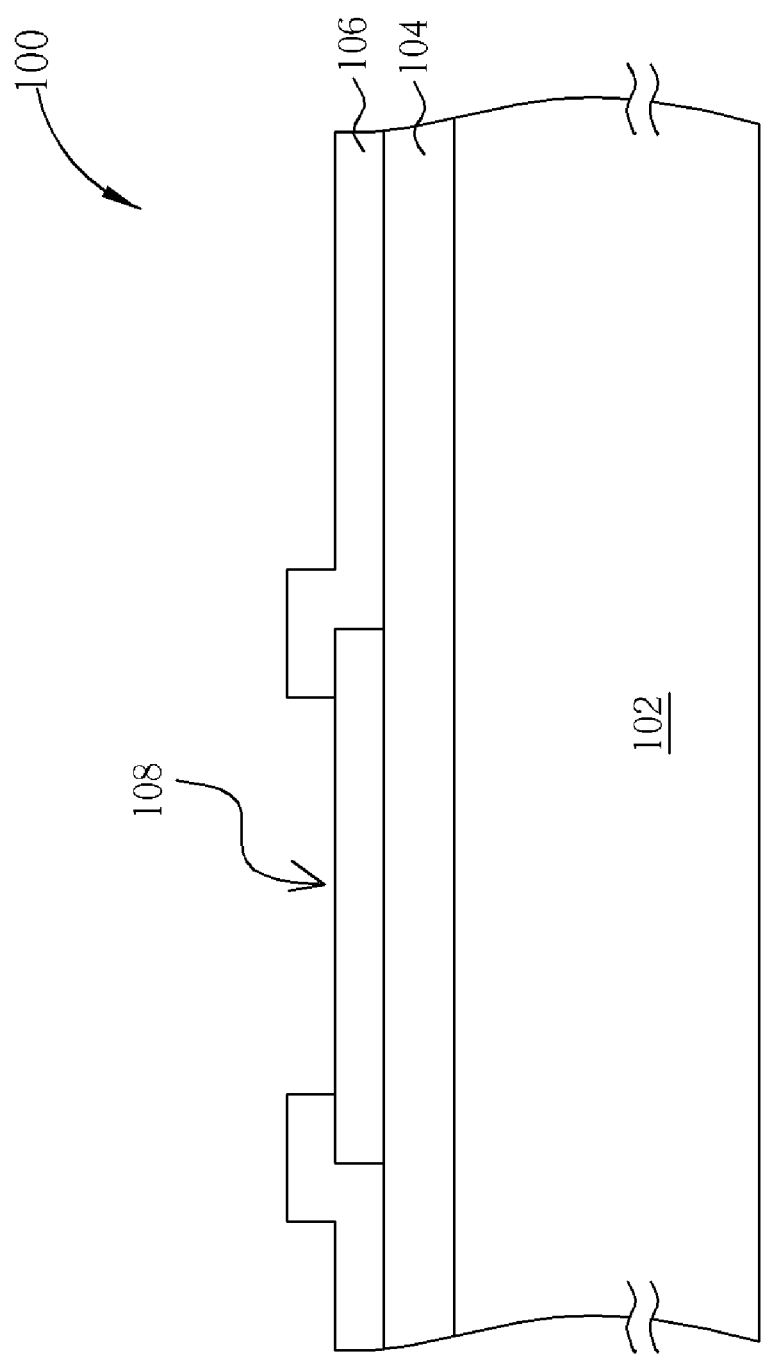
FIGS. 1-5 are schematic drawings illustrating a method for fabricating a transformer provided by U.S. Pat. No. 6,727,138.
Figure 2:
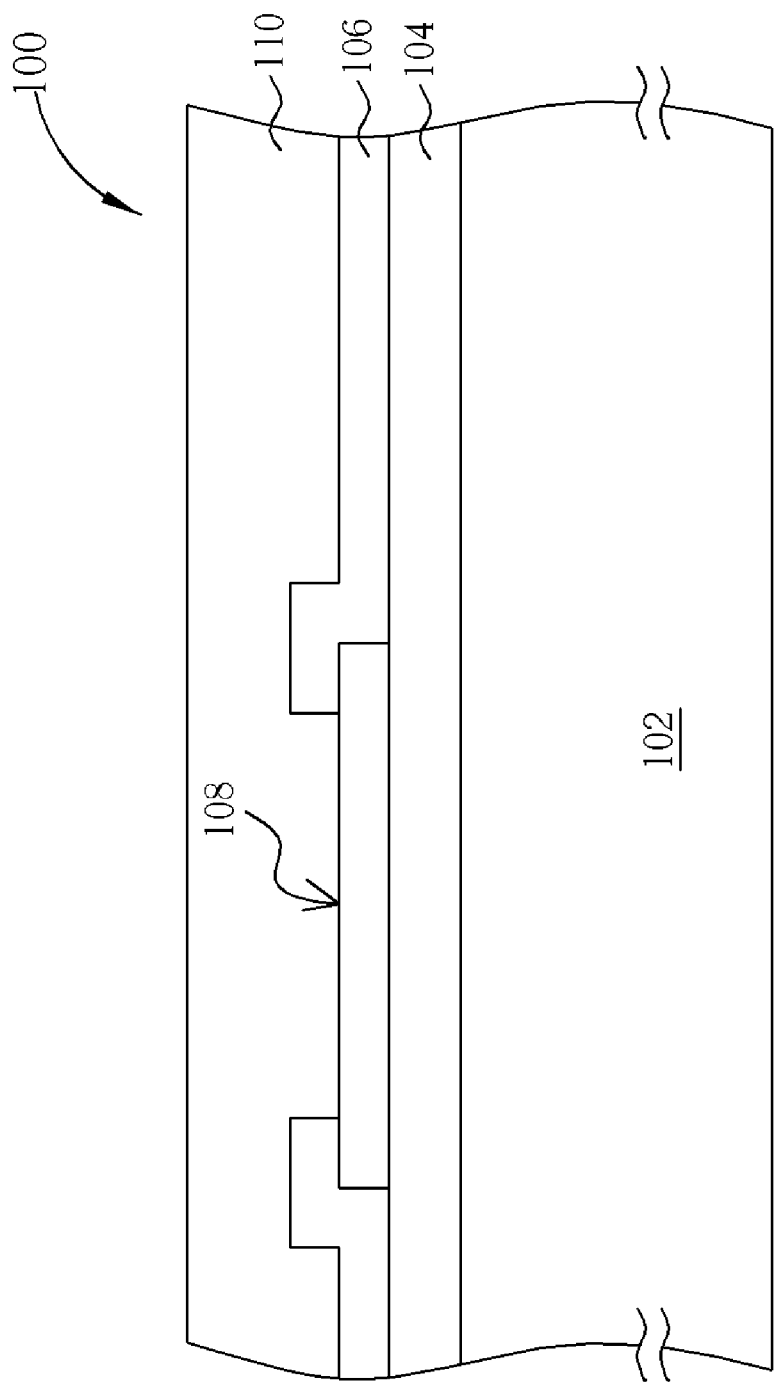
Figure 3:
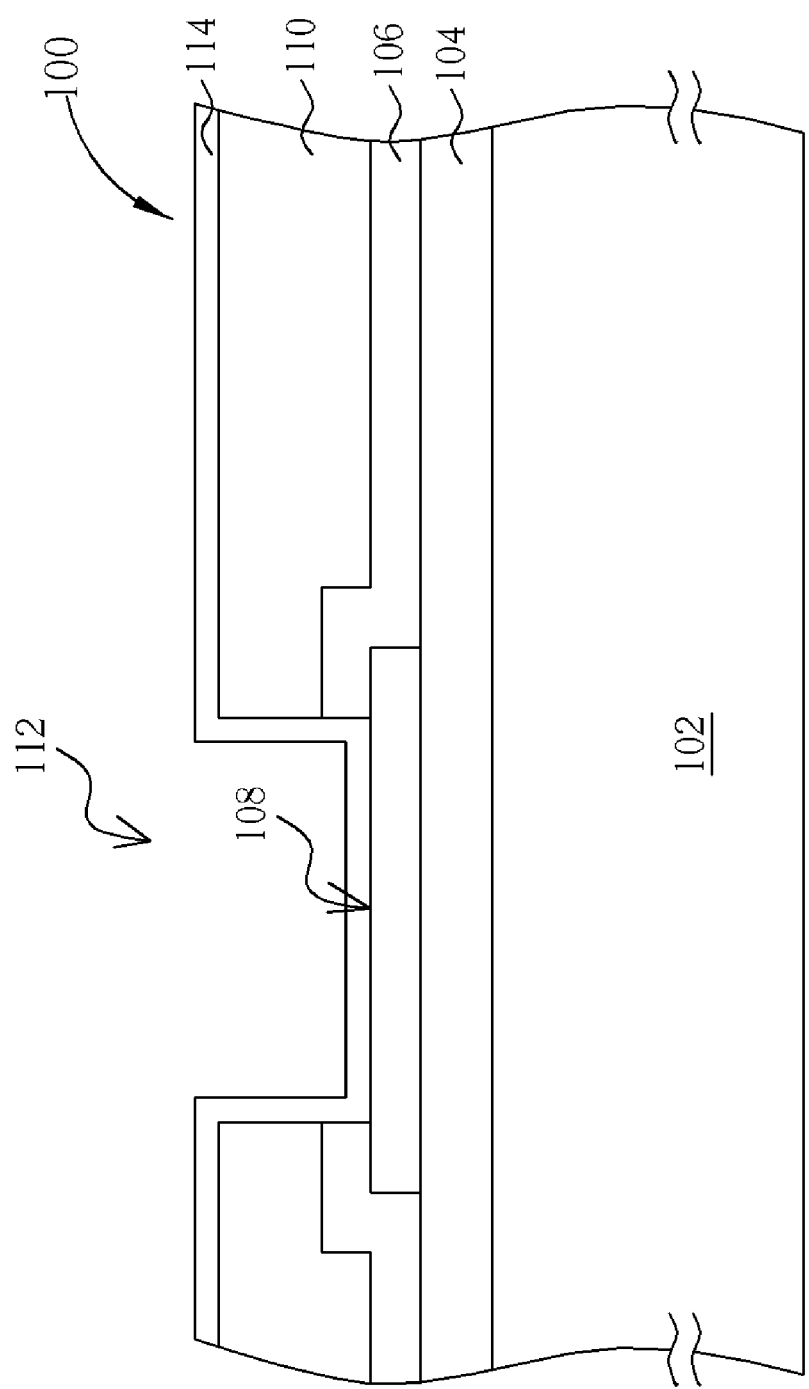
Figure 4:
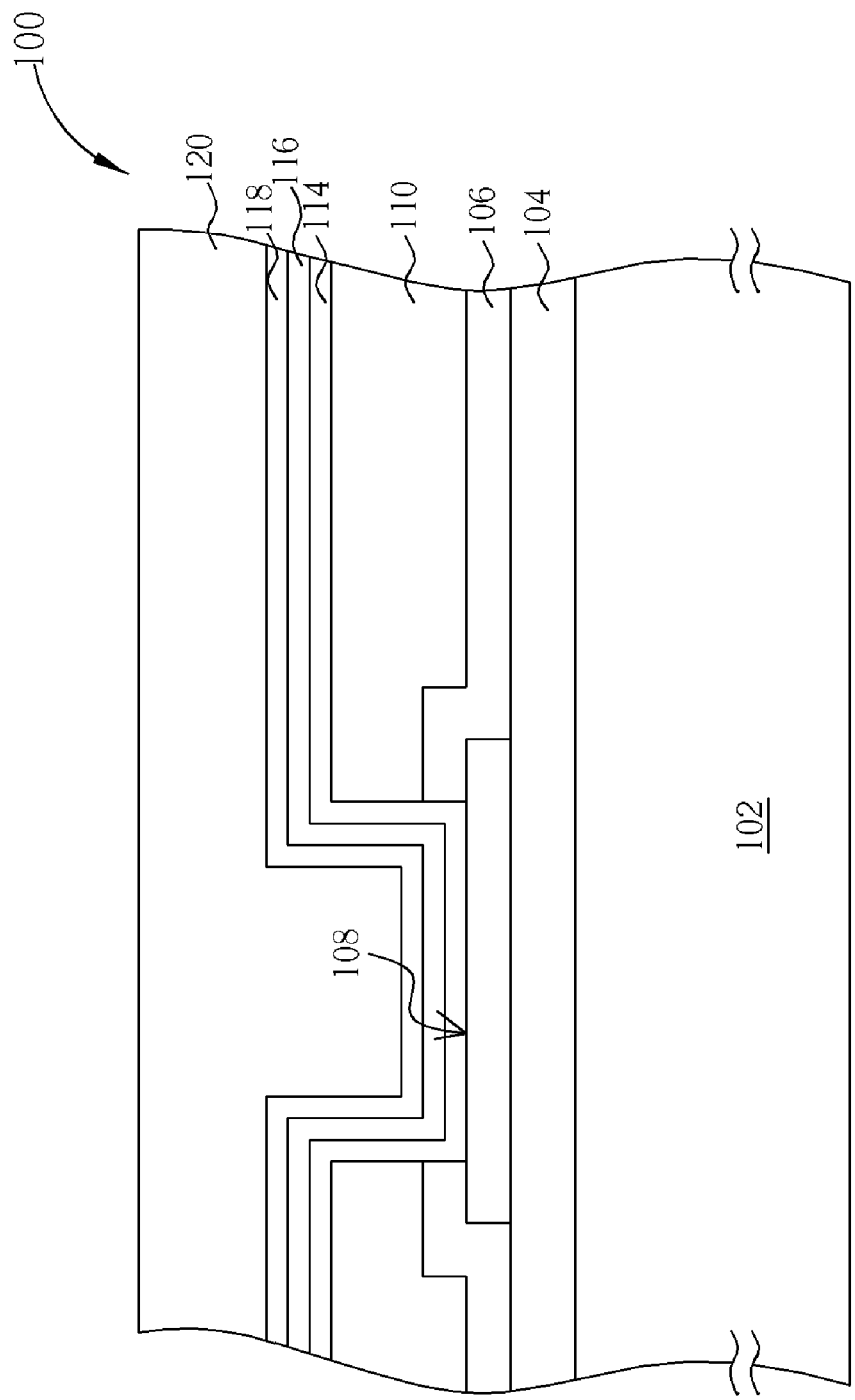
Figure 5:
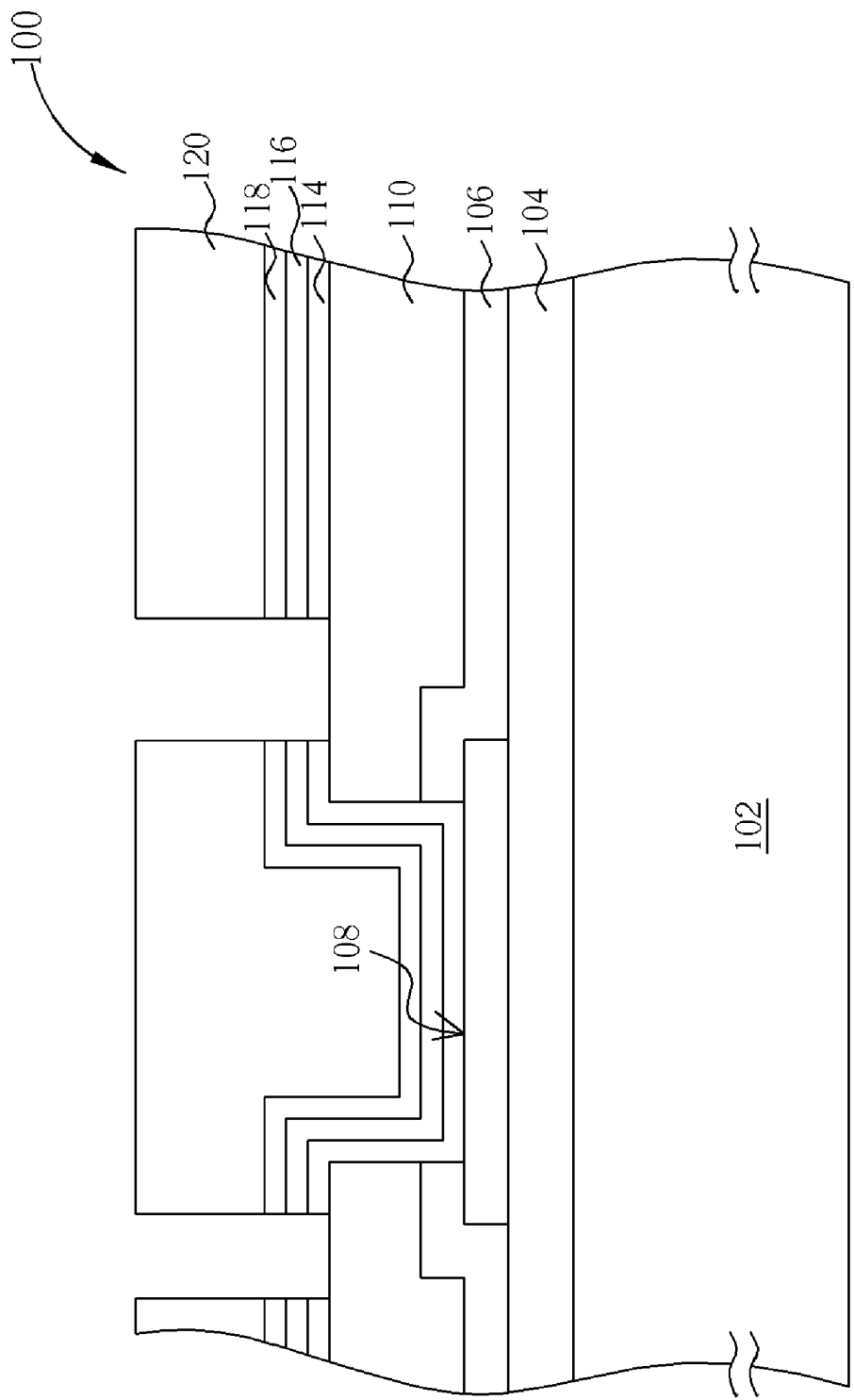
Figure 6:
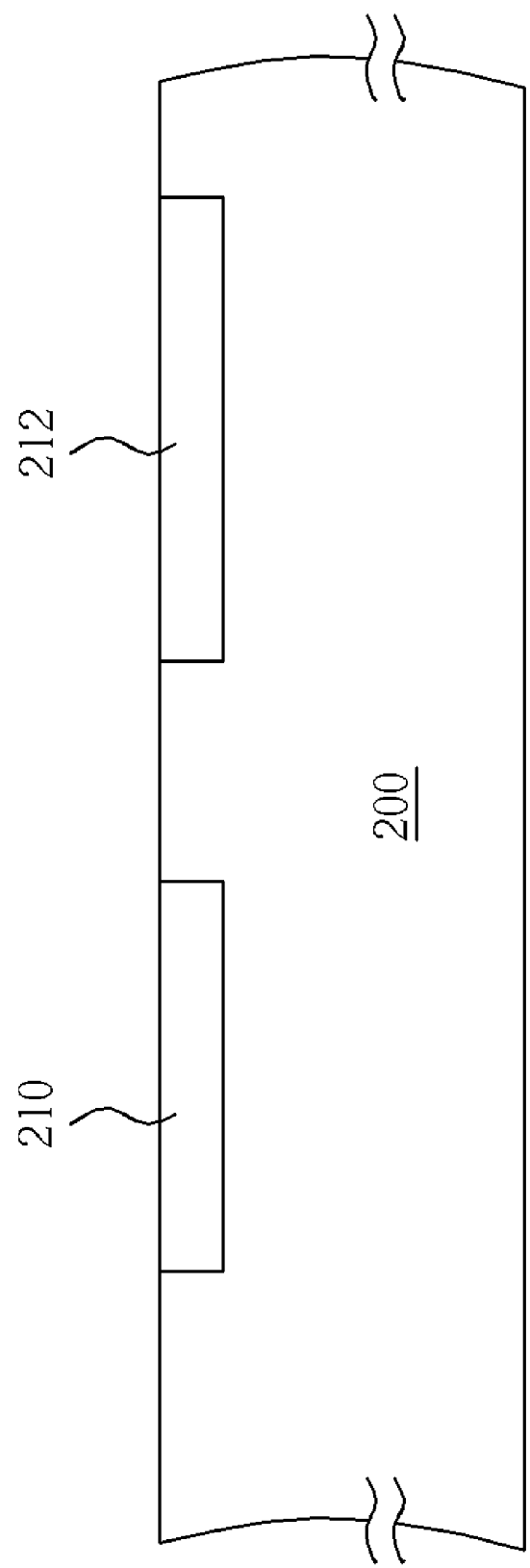
FIGS. 6-10 are schematic drawings illustrating the preferred embodiment according to the method provided by the present invention.

Please refer to FIGS. 6-10 which are schematic drawings illustrating the preferred embodiment according to the method for fabricating the transformer integrated with a semiconductor structure provided by the present invention. As shown in FIG. 6, a substrate 200 such as a semiconductor wafer or a SOI substrate is provided. The substrate 200 comprises an active circuit (not shown) and at least an interconnect metal layer (not shown). Then the substrate 200 is processed using copper interconnection technology to simultaneously form a primary winding layer 210 of a transformer and a top interconnection metal layer 212 thereon.

Figure 7:
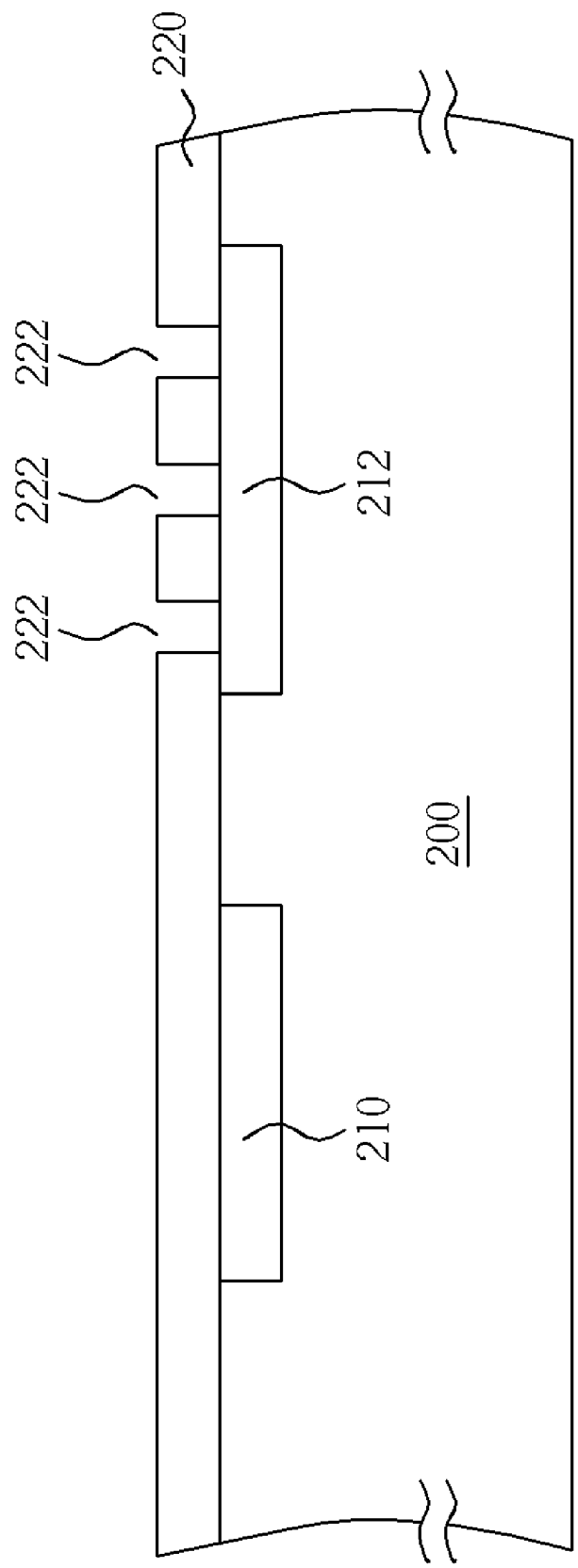

Please refer to FIG. 7. A passivation layer 220 having a thickness in a range of 100-500 angstroms is formed on the substrate 200. The passivation layer 220 covers the primary winding layer 210 and the top interconnection metal layer 212. Nevertheless, the passivation layer 220 has a plurality of openings 222 used to expose parts of the top interconnection metal layer 212.

Figure 8:
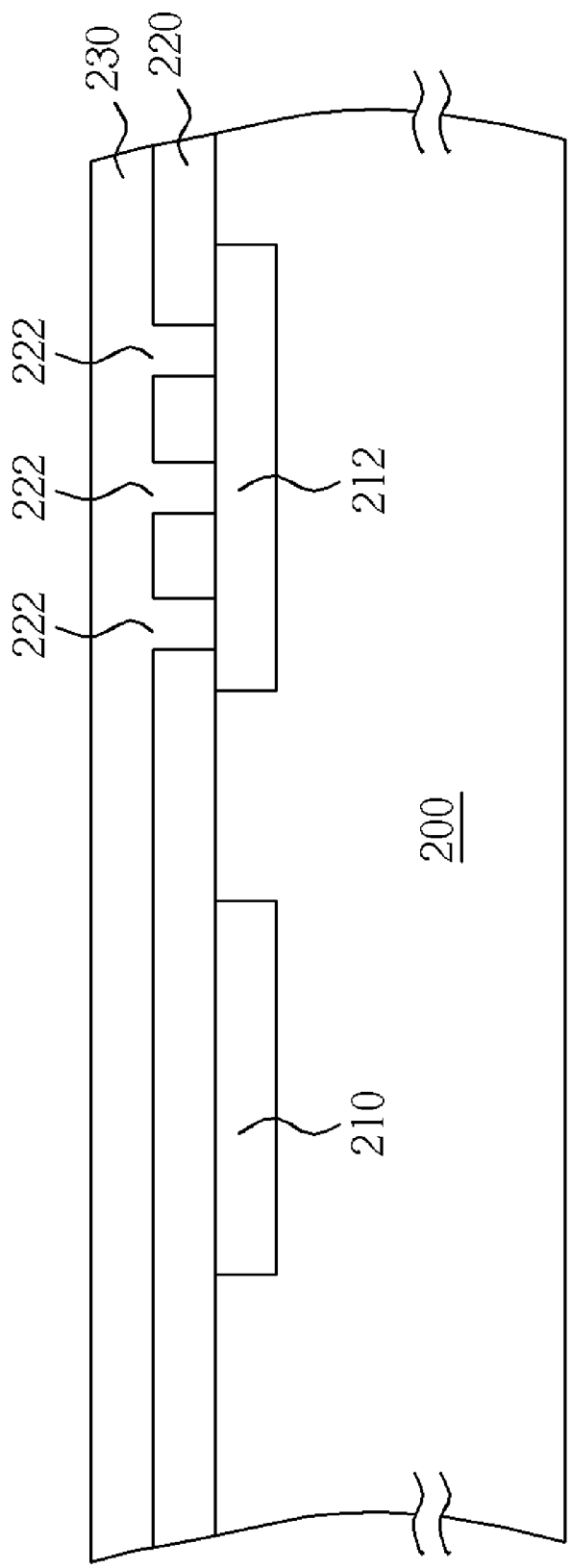
Figure 9:
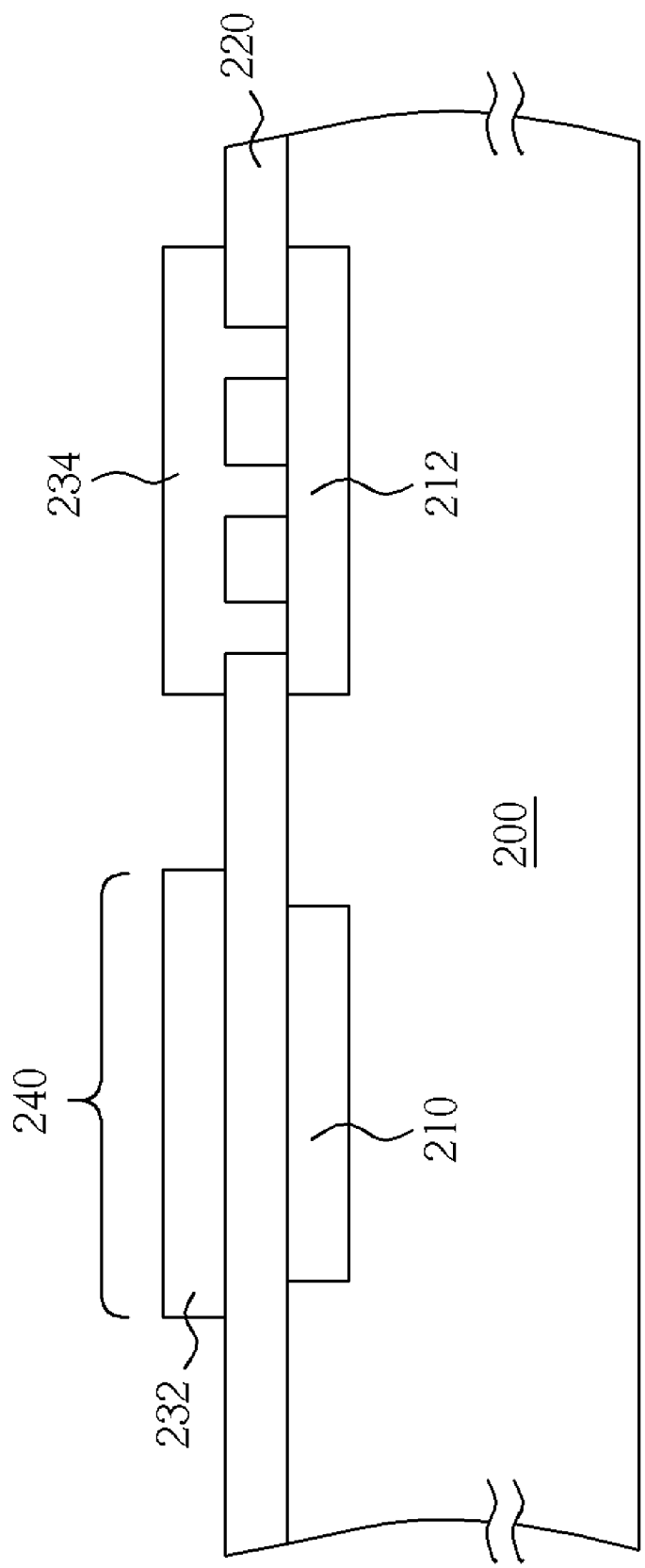

Please refer to FIGS. 8 and 9. Then a metal layer 230 filling the openings 222 is formed on the substrate 200. The metal layer 230 comprises titanium, titanium oxide, aluminum, or the alloys of the aforementioned metals. A photo-etching process is next performed on the metal layer 230 to simultaneously form a secondary winding layer 232 above the primary winding layer 210 and a bonding pad 234 above the top interconnection metal layer 212. The primary winding layer 210 and the secondary winding layer 232 construct the transformer 240 provided by the present invention. In addition, because the primary winding layer 210 and the top interconnection metal layer 212 are simultaneously formed on the substrate 200 by the same process and the secondary winding layer 232 and the bonding pad 234 are simultaneously formed on the passivation layer 220 by the same process, the primary winding layer 210 and the top interconnection metal layer 212 are approximately integrated in the same horizontal level while the secondary winding layer 232 and the bonding pad 234 are approximately integrated in the same horizontal level.

It is noteworthy that the bonding pad 234 is electrically connected to the top interconnection layer 212 through the metal layer 230 in the openings 222. In addition, to reduce the resistance of the transformer 240 and improve the quality factor, the width of the secondary winding layer is larger than the width of the primary winding layer 210.

Figure 10:
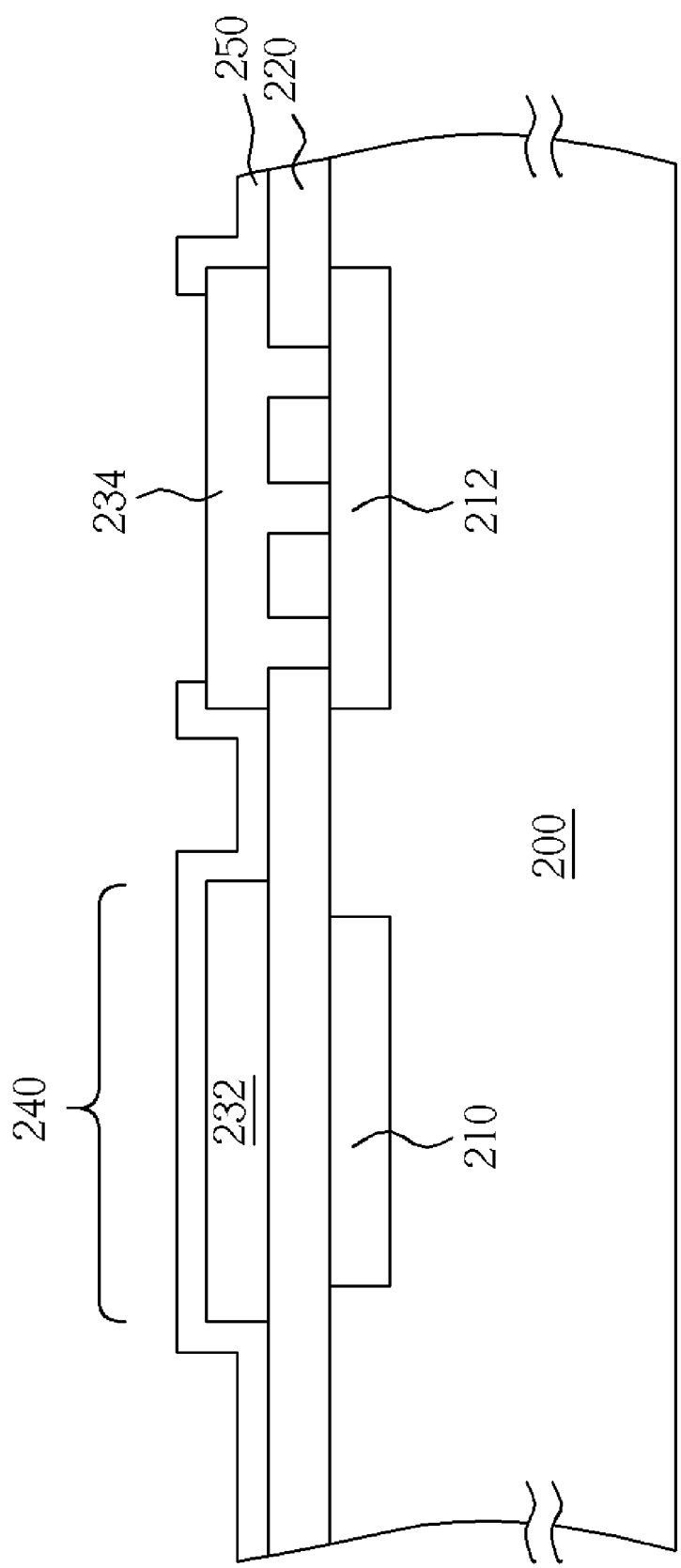

Please refer to FIG. 10. Finally a protection layer 250 covering the secondary winding layer 232 and the passivation layer 220 is formed on the substrate 200. The protection layer 250 exposes the bonding pad 234 for the electrical connection. The fabrication of the bonding pad 234 is completed at this step. The protection layer 250 comprises insulating material such as silicon nitride which can effectively separate moisture. In other words, at the same time when the fabrication of the bonding pad 234 is completed, the secondary winding layer 232 is entirely covered by the protection layer 250 and is unexposed. Therefore the secondary winding layer 232 provided by the present invention is prevented from being affected by the particles and the moisture.

Figure 11:
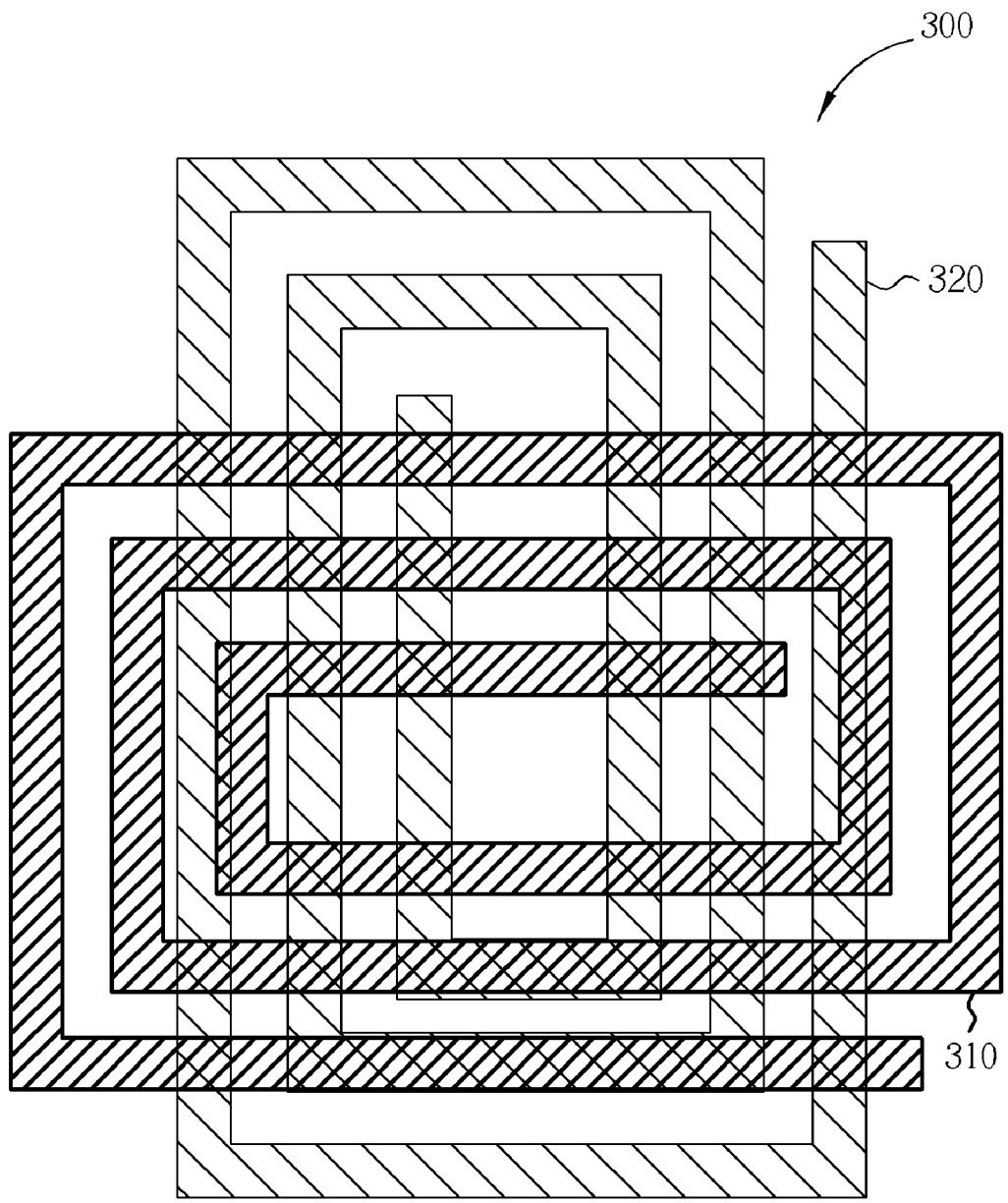
FIG. 11, is a schematic drawing illustrating the transformer according to the preferred embodiment provided by the present invention.

Please refer to FIG. 11, which is a schematic drawing illustrating the transformer integrated with a semiconductor structure provided by the present invention. For convenience, FIG. 11 only shows the primary winding layer and the secondary winding layer of the transformer with other parts omitted. As shown in FIG. 11, a primary winding layer 310 of a transformer 300 is simultaneously formed with a top interconnection metal layer (not shown) in the substrate by the copper interconnection technology; and the secondary winding layer 320 is simultaneously formed with at least a bonding pad (not shown) on the substrate. The transformer 300 further comprises a passivation layer (not shown) formed in between the primary winding layer 310 and the secondary winding layer 320.

It is noteworthy that the primary winding layer 310 and the secondary winding layer 320 respectively comprise a coil pattern. When a current passes through coil pattern of the primary winding layer 310, an inductive current is induced in the secondary winding layer 320 by magnetic induction. In other words, as long as the magnetic lines generated in the electrified coil pattern of the primary winding layer 310 also get across the coil pattern of the secondary winding layer 320, an inductive current is induced in the secondary winding layer 320. Therefore the coil patterns of the primary winding layer 310 and the secondary winding layer 320 can be entirely overlapping or, as the layout shows in the preferred embodiment, be partially overlapping. The coil patterns of the primary winding layer 310 and the secondary winding layer 320 can also be coaxial, preferably. In addition, to further reduce the resistance and improve the quality factor, the width the primary winding layer 310 is smaller than the width of the secondary winding layer 320. However, the number of coils and the overlapping type is not limited as shown in FIG. 11.

As abovementioned, according to the method for fabricating a transformer integrated in semiconductor structure provided by the present invention, the primary winding layer of the transformer is simultaneously formed with the top interconnection metal layer and the secondary winding layer is simultaneously formed with the bonding pad resulting in a simplified processes and reduced cost. Moreover, the transformer integrated in semiconductor structure provided by the present invention has an advantage of a secondary winding layer protected from moisture by a protection layer formed in the fabrication of the bonding pad. Therefore the transformer provided by the present invention has a high reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transformer integrated with a semiconductor structure comprising:
   a substrate;
   a primary winding layer and a top interconnection metal layer formed on the substrate;
   a passivation layer formed on the primary winding layer and the top interconnection metal layer, and the passivation layer having a plurality of openings exposing parts of the top interconnection metal layer; and
   a secondary winding layer and at least a bonding pad respectively formed on the passivation layer and the top interconnection metal layer, and the bonding pad being electrically connected to the top interconnection metal layer through the openings;
   wherein the primary winding layer and the secondary winding layer construct the transformer.

2. The transformer of claim 1, wherein the substrate comprises an active circuit and at least an interconnection metal layer.

3. The transformer of claim 1, wherein the passivation has a thickness in a range of 100-500 angstroms.

4. The transformer of claim 1, wherein the primary winding layer comprises copper.

5. The transformer of claim 1, wherein the secondary winding layer comprises titanium, titanium oxide, aluminum, or alloys of the aforementioned metals.

6. The transformer of claim 1, wherein the primary winding layer and the secondary winding layer respectively comprise a coil pattern.

7. The transformer of claim 6, wherein the coil patterns of the primary winding layer and the secondary winding layer are partially overlapping.

8. The transformer of claim 7, wherein the coil patterns of the primary winding layer and the secondary winding layer are preferably coaxial.

9. The transformer of claim 6, wherein the width of the primary coil layer is smaller than the width of the secondary coil layer.

10. The transformer of claim 1, wherein the primary winding layer and the top interconnection metal layer are approximately integrated in the same horizontal level.

11. The transformer of claim 1, wherein the secondary winding layer and the bonding pad are approximately integrated in the same horizontal level.

12. The transformer of claim 1 further comprising a protection layer on the substrate, the protection layer covering the secondary winding layer and exposing the bonding pad.

13. The transformer of claim 12, wherein the protection comprises silicon nitride.

* * * * *